US011688741B2

(12) United States Patent
Greene et al.

(10) Patent No.: US 11,688,741 B2
(45) Date of Patent: Jun. 27, 2023

(54) GATE-ALL-AROUND DEVICES WITH ISOLATED AND NON-ISOLATED EPITAXY REGIONS FOR STRAIN ENGINEERING

(71) Applicant: International Business Machines Corporation, Armonk, NY (US)

(72) Inventors: Andrew M. Greene, Slingerlands, NY (US); Julien Frougier, Albany, NY (US); Jingyun Zhang, Albany, NY (US); Sung Dae Suk, Watervliet, NY (US); Veeraraghavan S. Basker, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 17/213,399

(22) Filed: Mar. 26, 2021

(65) Prior Publication Data
US 2022/0310602 A1   Sep. 29, 2022

(51) Int. Cl.
*H01L 27/092* (2006.01)
*H01L 21/8238* (2006.01)
*H01L 29/78* (2006.01)
*H01L 29/06* (2006.01)

(52) U.S. Cl.
CPC .. *H01L 27/0924* (2013.01); *H01L 21/823821* (2013.01); *H01L 29/0649* (2013.01); *H01L 29/785* (2013.01); *H01L 2029/7858* (2013.01)

(58) Field of Classification Search
CPC ......... H01L 27/0924; H01L 21/823821; H01L 29/0649; H01L 29/785; H01L 29/42392; H01L 29/66545; H01L 29/78696
See application file for complete search history.

(56) References Cited

U.S. PATENT DOCUMENTS

| 9,397,200 | B2 | 7/2016 | Qi |
| 9,614,057 | B2 | 4/2017 | Doris et al. |
| 9,831,323 | B2 | 11/2017 | Kittl et al. |
| 9,905,672 | B2 | 2/2018 | Wang et al. |
| 10,249,739 | B2 | 4/2019 | Guillorn et al. |
| 10,283,638 | B2 | 5/2019 | Kittl et al. |
| 10,361,269 | B2 | 7/2019 | Yeung et al. |
| 11,437,483 | B2* | 9/2022 | Trivedi ........... H01L 21/823807 |
| 2017/0288015 | A1* | 10/2017 | Smith ................. H01L 27/1203 |

(Continued)

OTHER PUBLICATIONS

J. Zhang et al., "Full Bottom Dielectric Isolation to Enable Stacked Nanosheet Transistor for Low Power and High Performance Applications." International Electron Devices Meeting (IEDM), 2019, 11.6, 4 pp.

*Primary Examiner* — Dao H Nguyen
(74) *Attorney, Agent, or Firm* — Jeffrey M. Ingalls

(57) ABSTRACT

A semiconductor device is provided. The semiconductor device includes a semiconductor substrate; a transistor stack structure formed on the semiconductor substrate, the transistor stack structure including a first FET and a second FET, where the first FET is a different polarity than the second FET; a first source-drain epitaxial layer of the first FET formed directly on the substrate adjacent to the first FET; and a second source-drain epitaxial layer of the second FET formed on the substrate adjacent to the second FET, wherein a bottom dielectric isolation layer is formed between the substrate and the second epitaxial layer.

20 Claims, 16 Drawing Sheets

(56) References Cited

U.S. PATENT DOCUMENTS

| | | |
|---|---|---|
| 2020/0013878 A1 | 1/2020 | Colombeau et al. |
| 2020/0105868 A1 | 4/2020 | Loubet et al. |
| 2020/0105869 A1 | 4/2020 | Loubet et al. |
| 2021/0257453 A1* | 8/2021 | Trivedi ............... H01L 29/0847 |
| 2021/0305388 A1* | 9/2021 | Lilak ................... H01L 21/0217 |
| 2021/0408284 A1* | 12/2021 | Agrawal ............. H01L 29/0649 |

* cited by examiner

GATE-ALL-AROUND DEVICES WITH ISOLATED AND NON-ISOLATED EPITAXY REGIONS FOR STRAIN ENGINEERING

BACKGROUND

The present disclosure relates to fabrication methods and resulting structures for semiconductor devices. More specifically, the present disclosure relates to fabrication methods and resulting structures for field effect transistors (FETs) with stacked n-type and p-type nanosheets for complementary metal oxide semiconductor (CMOS) technologies.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Nanosheets generally refer to two-dimensional nanostructures with a thickness range on the order of about 1 nanometer (nm) to about 100 nm, and they can facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channel regions for a reduced device footprint and improved control of channel current flow. Nanosheet transistor configurations may enable fuller depletion in the nanosheet channel regions and reduce short-channel effects. Accordingly, nanosheets and nanowires are seen as feasible options for reducing the footprints of semiconductor transistor devices to 7 nanometers or less.

SUMMARY

Embodiments of the present disclosure relate to a semiconductor device. The semiconductor device includes a semiconductor substrate; a transistor stack structure formed on the semiconductor substrate, the transistor stack structure including a first FET and a second FET, where the first FET is a different polarity than the second FET; a first source-drain epitaxial layer of the first FET formed directly on the substrate adjacent to the first FET; and a second source-drain epitaxial layer of the second FET formed on the substrate adjacent to the second FET, wherein a bottom dielectric isolation layer is formed between the substrate and the second epitaxial layer.

Embodiments of the present disclosure relate to a method of manufacturing a semiconductor device. The method includes forming a transistor stack structure on a semiconductor substrate, the transistor stack structure including a first FET and a second FET, where the first FET is a different polarity than the second FET; forming a first source-drain epitaxial layer directly on the substrate adjacent to the first FET; and forming a second source-drain epitaxial layer on the substrate adjacent to the second FET, wherein a bottom dielectric isolation layer is formed between the substrate and the second epitaxial layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
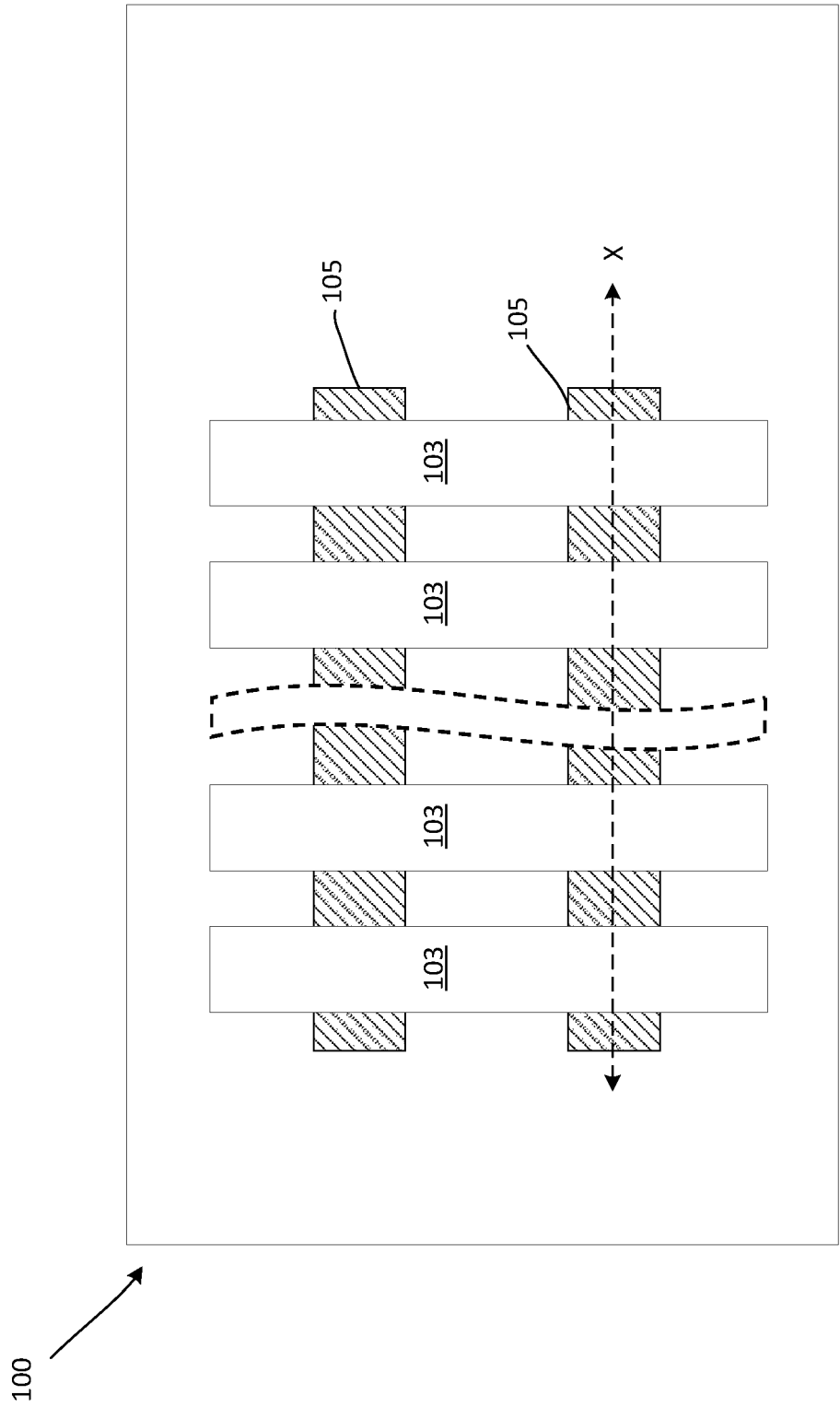
FIG. 1 is a top view of a semiconductor device, according to embodiments.

The present disclosure describes nanosheet FET devices and methods of manufacturing the FET devices. In particular, the present disclosure describes nanosheet FET devices that co-integrate bottom dielectric isolation (BDI) devices and non-BDI devices for CMOS technologies.

Due to certain performance considerations with nanosheet FET devices, it may be desirable to incorporate bottom dielectric isolation (BDI) layers in the pFET and nFET regions. However, it may be difficult to enable internal strain in the pFET region with the use of a BDI layer because a nucleation component may be lost when performing epitaxy on the underlying substrate. In other words, when performing an epitaxial processing step in the pFET region (e.g., a BDI layer being formed directly on the substrate), some of the strain benefit may be lost, which is generally desirable for pFET region performance of the nanosheet FET device. In general, the strain increases the hole mobility in the pFET channel region, and this may result in increased performance in this region. In one example where a (100) crystallographic lattice plane exists on the underlying silicon substrate, there may be insufficient hole mobility. Increasing the strain on the (100) surface may enhance the hole mobility and thereby increase the performance of pFET region of the FET device. Therefore, it may be desirable to manufacture nanosheet FET structures with BDI layers, while also enhancing strain in the pFET regions.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si. Moreover, as fabrication trends aim to continue reducing the footprints of semiconductor devices, the total contact area between the upper surface of the source/drain epitaxy structure and the lower surface of the metal source/drain contact may be reduced.

For nanosheet devices formed on a bulk substrate, the source and drain regions are epitaxially grown from (1) the side of the silicon nanosheets and (2) the bottom silicon substrate. As mentioned above, it may be desirable to incorporate bottom dielectric isolation (BDI) layers in the pFET and nFET regions. However, it may be difficult to enable internal strain in the pFET region with the use of a BDI layer because a nucleation component may be lost when performing epitaxy on the underlying substrate. In other words, when performing an epitaxial processing step in the pFET region (e.g., a BDI layer being formed directly on the substrate), some of the strain benefit may be lost, which is generally desirable for pFET region performance of the nanosheet FET device. In general, the strain increases the hole mobility in the pFET channel region, and this may result in increased performance in this region. Accordingly, it may be desirable to manufacture a nanosheet FET device that co-integrates a BDI layer in a first portion of the device (e.g., the nFET device region) and a non-BDI layer in a second portion of the device (e.g., the pFET device region) such that improved strain (and hence improved hole mobility) may be realized in the second portion.

Referring now to the drawings in which like numerals represent the same or similar elements and initially to FIG. 1, this figure depicts a simple diagram of a top view of a semiconductor device 100, according to embodiments. FIG. 1 is only for reference purposes and illustrates a top-down view of locations of the nanosheets 105 (see e.g., FIG. 3) and future gates. For simplicity and ease of understanding, FIG. 1 omits some layers (elements) so as to not obscure the figure.

Figure 2:
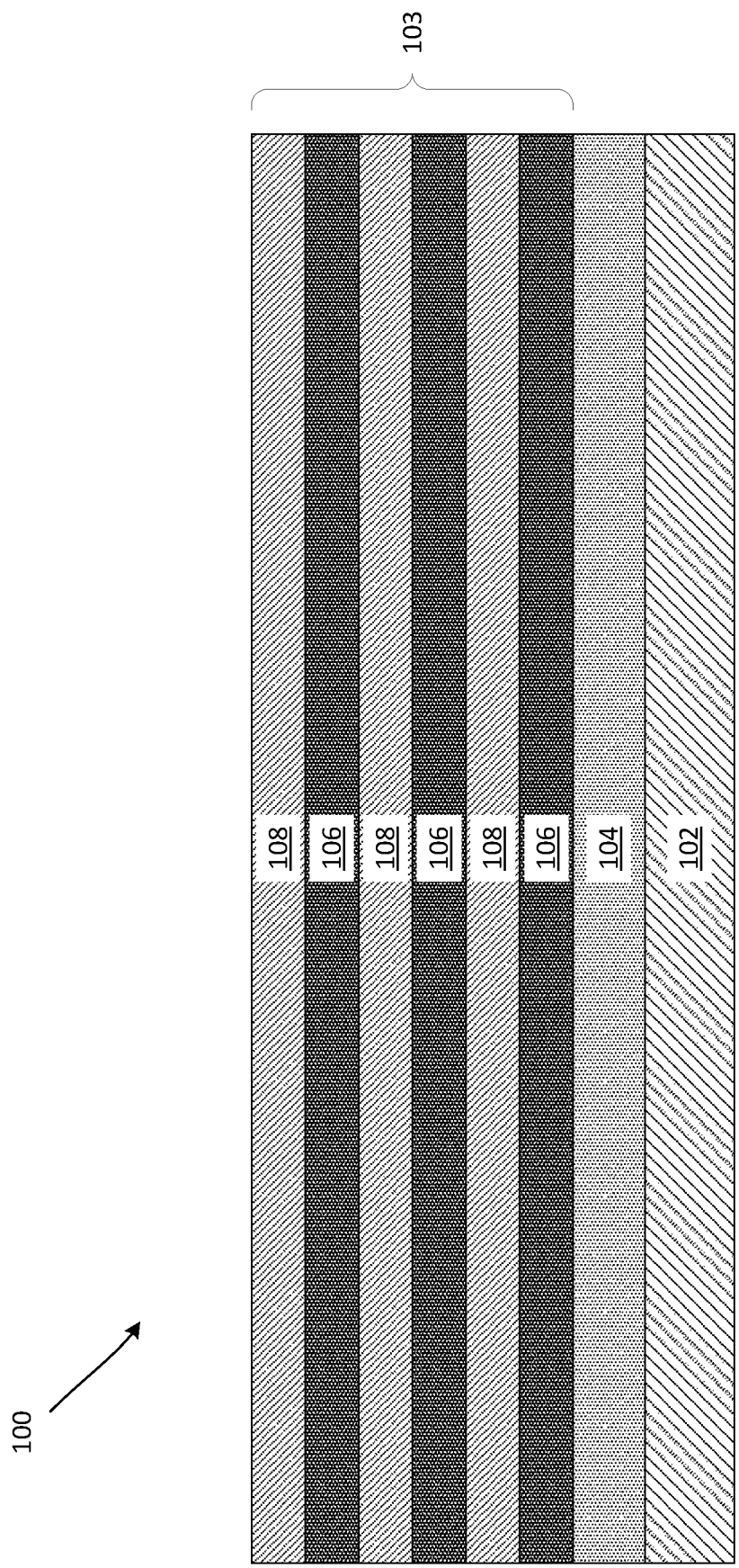
FIG. 2 is a cross-sectional view of the semiconductor device of FIG. 1 after additional fabrication operations, according to embodiments.

Referring now to FIG. 2, this figure depicts a cross-sectional view of the semiconductor device 100 shown in FIG. 1 taken along line X, according to embodiments. As shown in FIG. 2, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) that those listed above.

As shown in FIG. 2, after initial fabrication processing, a bottom dielectric isolation (BDI) layer 104 is formed on the top surface of the substrate 102. Embodiments of the present disclosure provide integration methods to form a BDI layer for nanosheet FETs by oxygen diffusion through a rare earth oxide/silicon substrate interface. For example, a rare earth oxide buffer epitaxy layer is grown on, for example, a silicon substrate (e.g., substrate 102) at the beginning of the process flow. The process includes oxygen diffusion through the rare earth oxide buffer layer to the silicon substrate interface, thereby forming a bottom silicon dioxide ($SiO_2$) dielectric layer. Utilizing the lattice matching (which can be heteroepitaxy or domain matching epitaxy) from the rare earth oxide buffer layer, a nanosheet layer stack (e.g., silicon germanium/silicon nanosheet layers) is epitaxially grown for downstream nanosheet device processes. Accordingly, the BDI layer 104 isolates the source/drain regions from the substrate 102 and/or isolates the nanosheet region from the substrate 102.

In certain embodiments, a sacrificial epitaxial layer (not shown) is first formed on the substrate 102 in place of BDI layer 104 as part of the epitaxy stack. The sacrificial epitaxial layer may be comprised of, for example, SiGe with Ge concentration ranging from 50% to 75%, or any other suitable material. It is then selectively removed and replaced by a dielectric material during downstream processing to create a continuous isolation layer under the source-drain and gate regions of active FET devices. In certain examples with just the semiconductor substrate 102, the sacrificial epitaxial layer is formed for the case of bottom dielectric isolation flow. However, in other examples, where there is a Silicon-On-Insulator (SOI) substrate with a buried oxide (BOX), the sacrificial epitaxial layer may be omitted.

In certain embodiments, a punch-through-stopper (PTS) (or ion implantation) may be applied to the substrate 102. Thus, the substrate may be implanted with, for example, a dopant to prevent or reduce current leakage in between the source and drain regions of the respective FET structures.

As shown in FIG. 2, a multi-layer nanosheet stack 103 is formed on the BDI layer 104. The nanosheet stack 103 includes a sacrificial layer 106, followed by the formation of an active semiconductor layer 108. In certain examples, the first one of the sacrificial layers 106 is initially formed directly on an upper surface of the BDI layer 104. In other examples, certain layers may be formed between the upper surface of the BDI layer 104 and the first one of the sacrificial layers 106. In an example, the sacrificial layer 106 is composed of silicon-germanium (e.g., SiGe35, or more generally, where the Ge ranges from about 15-35%). Next, an active semiconductor layer 108 is formed on an upper surface of the first one of the sacrificial layers 106. In an example, the active semiconductor layer 108 is composed of silicon. Several additional layers of the sacrificial layer 106 and the active semiconductor layer 108 are alternately formed. In the example illustrated in FIG. 1, there are a total of three sacrificial layers 106 and three active semiconductor layers 108 that are alternately formed to form the nanosheet stack 103. However, it should be appreciated that any suitable number of alternating layers may be formed.

In certain embodiments, the sacrificial layers 106 have a vertical thickness ranging, for example, from approximately 3 nm to approximately 20 nm. In certain embodiments, the active semiconductor layers 108 have a vertical thickness ranging, for example, from approximately 3 nm to approximately 10 nm. Although six total layers are illustrated in FIG. 2, it should be appreciated that the nano sheet stack 103 can include any suitable number of layers. Although the range of 3-20 nm is cited as an example range of thickness, other thickness of these layers may be used. In certain examples, certain of the sacrificial layers 106 or the active semiconductor layers 108 may have different thicknesses relative to one another. Therefore, multiple epitaxial growth processes can be performed to form the alternating sacrificial layers 106 and the active semiconductor layers 108.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers 106.

Figure 3:
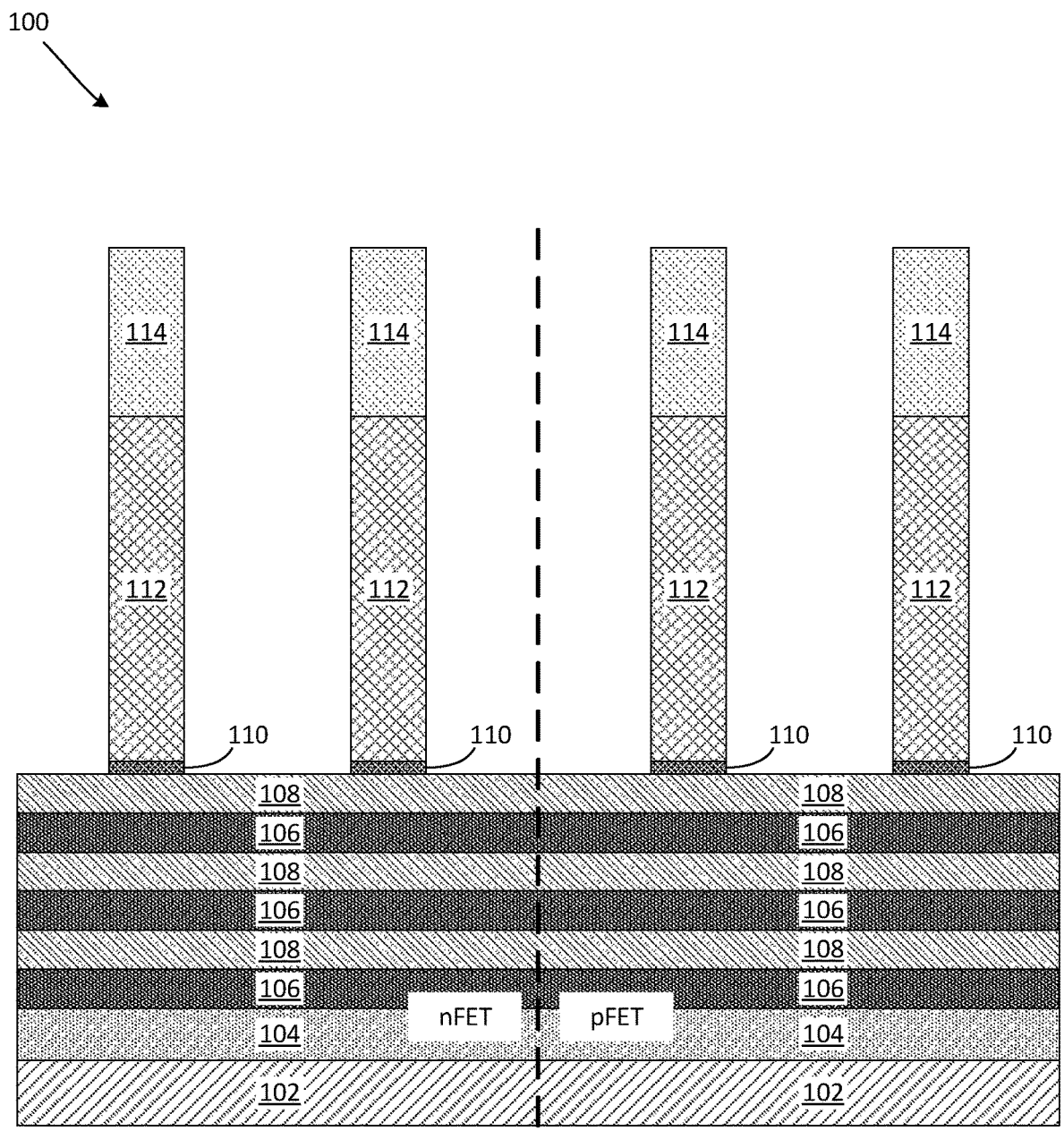
FIG. 3 is a cross-sectional view of the semiconductor device FIG. 2 after additional fabrication operations, according to embodiments.

Referring now to FIG. 3, a cross-sectional view of the semiconductor device 100 of FIG. 2 is shown at a subsequent stage of the manufacturing process, according to embodiments. In FIG. 3, following the formation of the nanosheet stack 103 (e.g., all of the sacrificial layers 106 and semiconductor layers 108) a dummy gate 112 is formed on the topmost active semiconductor layer 108 by any suitable deposition and/or patterning process. The dummy gate 112 may be formed by any suitable deposition technique known to one of skill in the art. In one example, the dummy gate 112 is formed by depositing a thin $SiO_2$ dummy gate oxide layer 110, followed by depositing a layer of amorphous silicon (a-Si) as the dummy gate 112. The dummy gate 112 may be composed of polycrystalline silicon (poly silicon), amorphous silicon, and/or an oxide, such as, $SiO_2$. A gate hardmask 114 is also formed on a top sides of the dummy gate 112. The gate hardmask 114 is formed for subsequent nanosheet patterning. The gate hardmask can be composed of various nitride materials including, but not limited to, a nitride, an oxide, silicon nitride (SiN), and/or a combination of a nitride material and an oxide material. In certain embodiments, although not shown in the cross-sectional view of FIG. 3, the dummy gate 112 extends into and out of the page to wrap around the edges of the nanosheet stack 103, and the subsequent removal of the dummy gate 112 (see, FIG. 13) allows an access point for later removal of the sacrificial layers 106. In certain examples, gate patterning may be performed by first patterning the gate hardmask 114 and then using the patterned gate hardmask 114 to etch the dummy gates 112.

Figure 4:
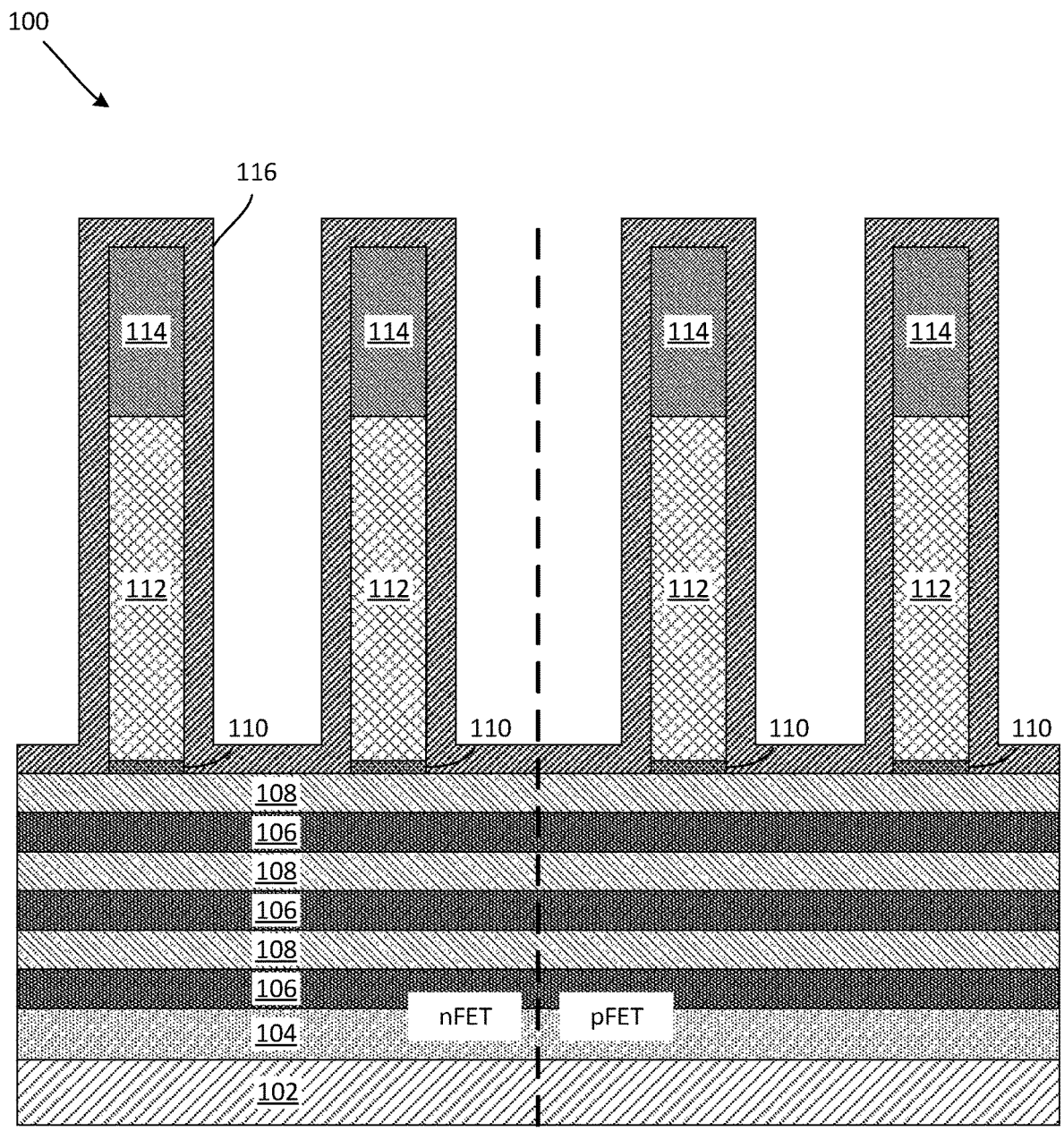
FIG. 4 is a cross-sectional view of the semiconductor device of FIG. 3 after additional fabrication operations, according to embodiments.

Referring now to FIG. 4, a cross-sectional view of the semiconductor device 100 of FIG. 3 is shown at a subsequent stage of the manufacturing process, according to embodiments. In FIG. 4, a gate spacer 116 is conformally deposited over the dummy gates 112 and dummy gate hardmask 114. As shown in FIG. 4, the semiconductor device 100 includes an nFET structure on the left side of the dashed line and a pFET structure on the right side of the dashed line. However, it should be appreciated that in other examples, the nFET structure may be positioned to the right of the dashed line and the pFET structure may be positioned on the left side. It should be appreciated that although the dashed line shown in FIG. 4 appears to show the pFET side in close proximity with the nFET side, there may be more space separating the two regions. That is, the figures are just This is just an illustration. In reality the devices would not be directly adjacent as it is depicted in the figures. They could be in different regions of the wafer. In certain embodiments, the gate spacer 116 may be comprised of the same materials as the BDI layer 104. In other embodiments, the gate spacer 116 is comprised of different materials from the BDI layer 104, which may aide with etching selectivity in downstream manufacturing processes, as described hereinbelow.

Figure 5:
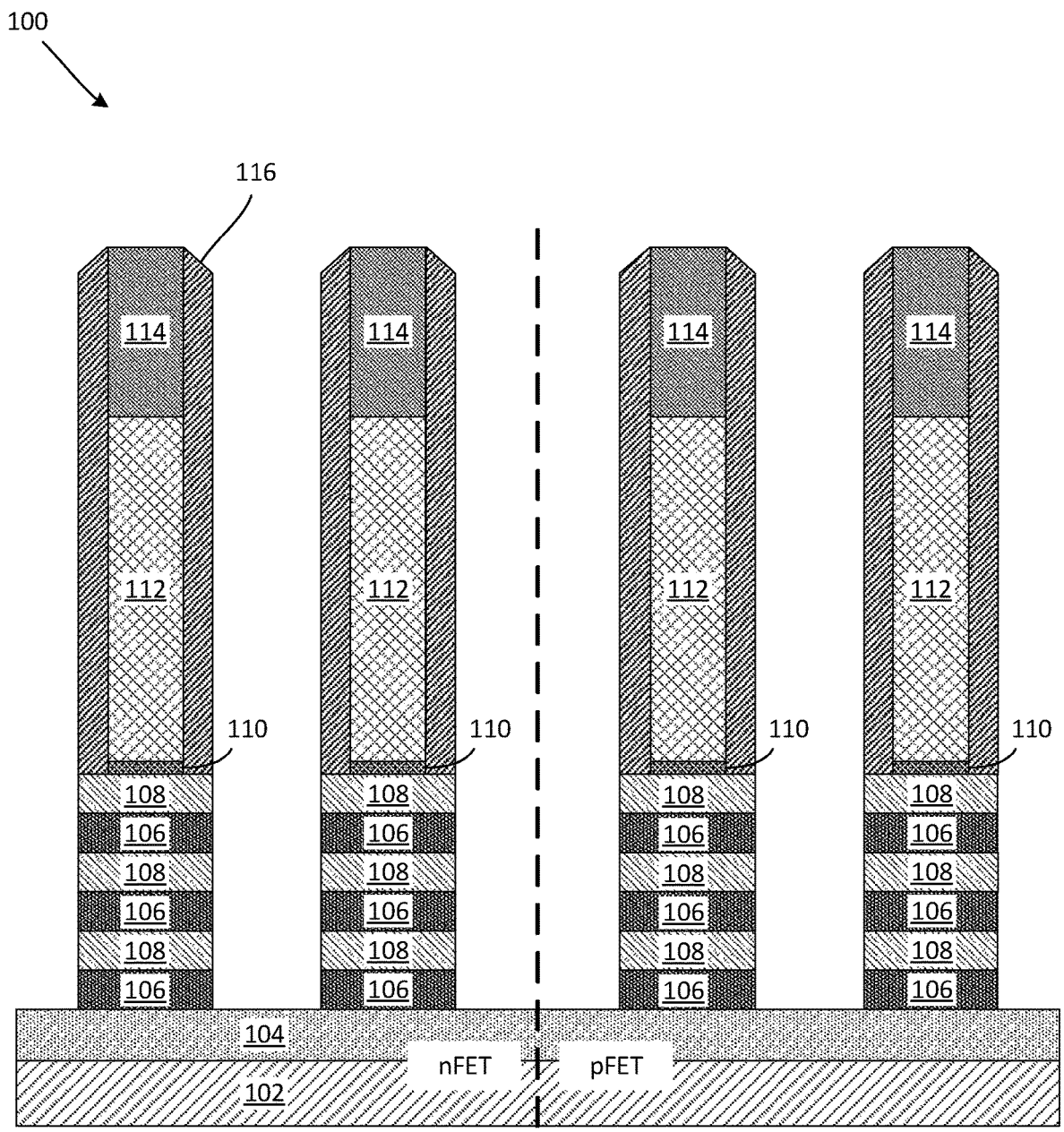
FIG. 5 is a cross-sectional view of the semiconductor device of FIG. 4 after additional fabrication operations, according to embodiments.

Referring now to FIG. 5, a cross-sectional view of the semiconductor device 100 of FIG. 4 is shown at a subsequent stage of the manufacturing process, according to embodiments. In FIG. 5, the semiconductor device 100 is subjected to a fin etching process to expose portions of the BDI layer 104. The fin etching process is followed by a directional reactive ion etch (RIE) process, which is capable of removing portions of the sacrificial layers 106 and the active semiconductor layers 108 not covered by the dummy gate 112 (and the dummy gate hardmask 114) and the spacer 116. The RIE can use a boron-based chemistry or a chlorine-based chemistry, for example, which selectively recesses the exposed portions sacrificial layers 106 and the active semiconductor layers 108 without significantly attacking the BDI layer 104.

Figure 6:
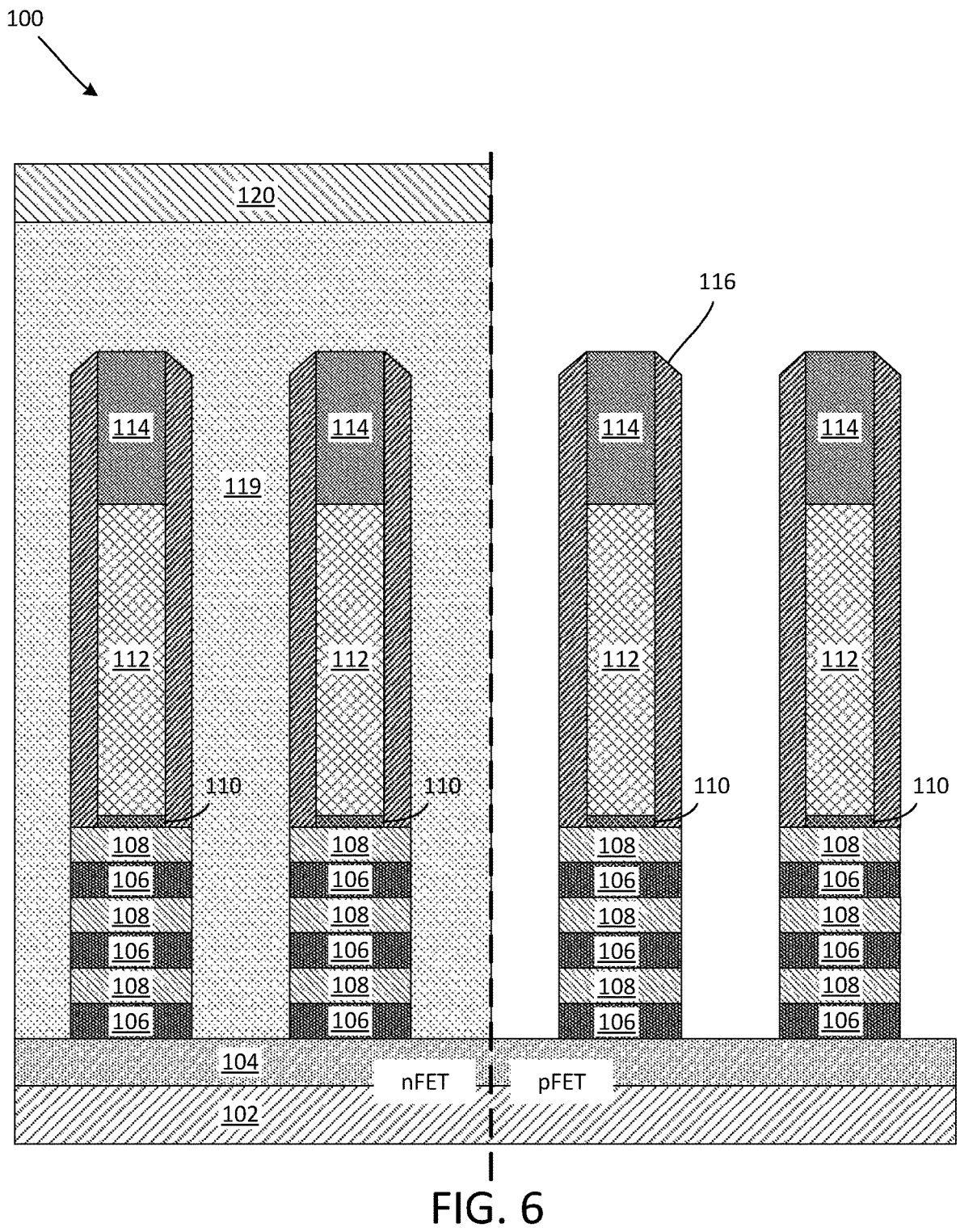
FIG. 6 is a cross-sectional view of the semiconductor device of FIG. 5 after additional fabrication operations, according to embodiments.

Referring now to FIG. 6, a cross-sectional view of the semiconductor device 100 of FIG. 5 is shown at a subsequent stage of the manufacturing process, according to embodiments. As shown in FIG. 6, an organic planarization layer 119 is initially formed over the entire substrate 102 (i.e., initially formed over the nFET and pFET regions). Then, another mask layer 120 such as an anti-reflective coating (ARC) is selectively formed one the organic planarization layer 119 in the nFET region only. Then, an etching process is performed to remove the organic planarization layer 119 in the pFET region down to the level of the top of the BDI layer 104.

Figure 7:
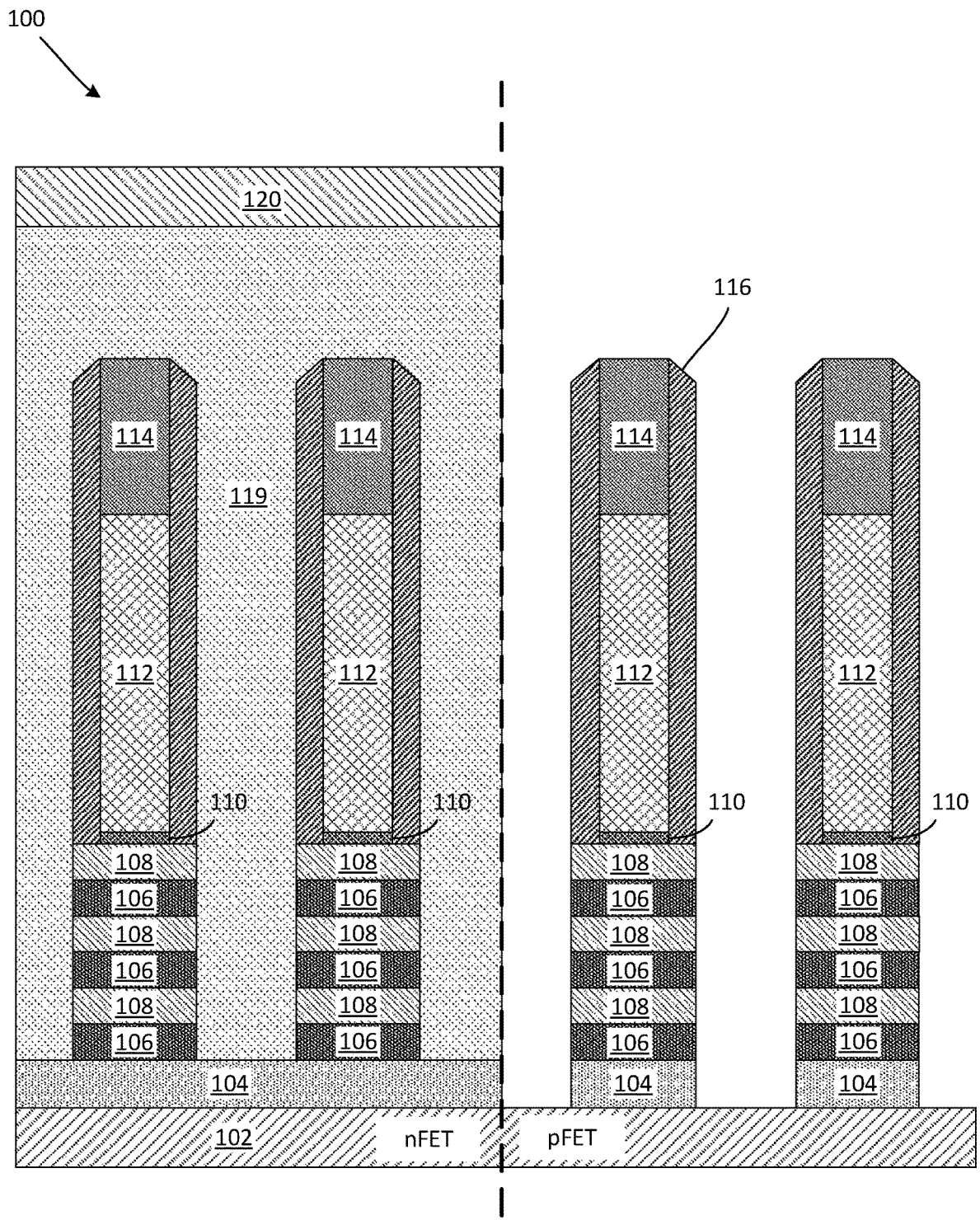
FIG. 7 is a cross-sectional view of the semiconductor device of FIG. 6 after additional fabrication operations, according to embodiments.

Referring now to FIG. 7, a cross-sectional view of the semiconductor device 100 of FIG. 6 is shown at a subsequent stage of the manufacturing process, according to embodiments. As shown in FIG. 7, further material of the BDI layer 104 is removed in the Source-Drain regions self-aligned to the gates (i.e., a dielectric punch) from the pFET side by etching to expose the substrate 102. In certain examples, the etching process is an anisotropic etch, which may also remove or pull down some portion of the spacer 116. However, in certain examples, this spacer 116 pulldown may be compensated for by modifying the hardmask stack (i.e., the dummy gate oxide layer 110, the dummy gate 112 and the dummy gate hardmask 114) to make it taller. In other examples, different dielectric materials may be used for the spacer 116 relative to the BDI layer 104 to allows for etching selectivity of the spacer 116 relative to the BDI layer 104.

Figure 8:
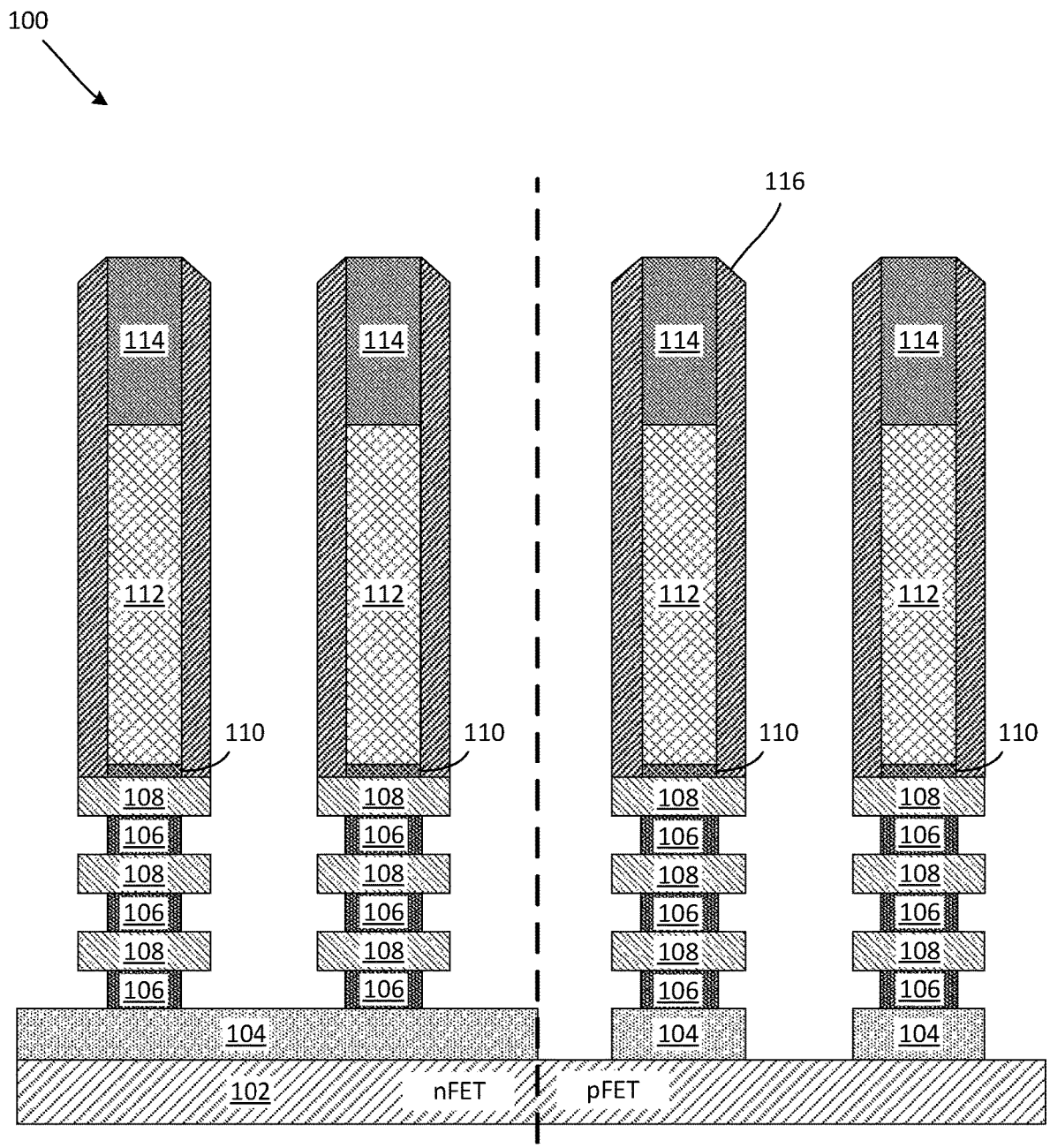
FIG. 8 is a cross-sectional view of the semiconductor device of FIG. 7 after additional fabrication operations, according to embodiments.

Referring now to FIG. 8, a cross-sectional view of the semiconductor device 100 of FIG. 7 is shown at a subsequent stage of the manufacturing process, according to embodiments. As shown in FIG. 8, the mask layer 120 and the organic planarization layer are removed from the nFET side of the semiconductor device 100. Accordingly, as shown in FIG. 8, the BDI layer 104 still extends all the way across in the nFET region. However, due to the BDI layer 104 removal step described above with respect to FIG. 7, portions of the BDI layer 104 in the pFET region have been removed to expose the substrate. As also shown in FIG. 8, portions of the sacrificial layers 106 are recessed in an inward direction (i.e., an inner spacer indentation process) so that the processed widths of the sacrificial layers 106 are less than widths of the active semiconductor layers 108.

Figure 9:
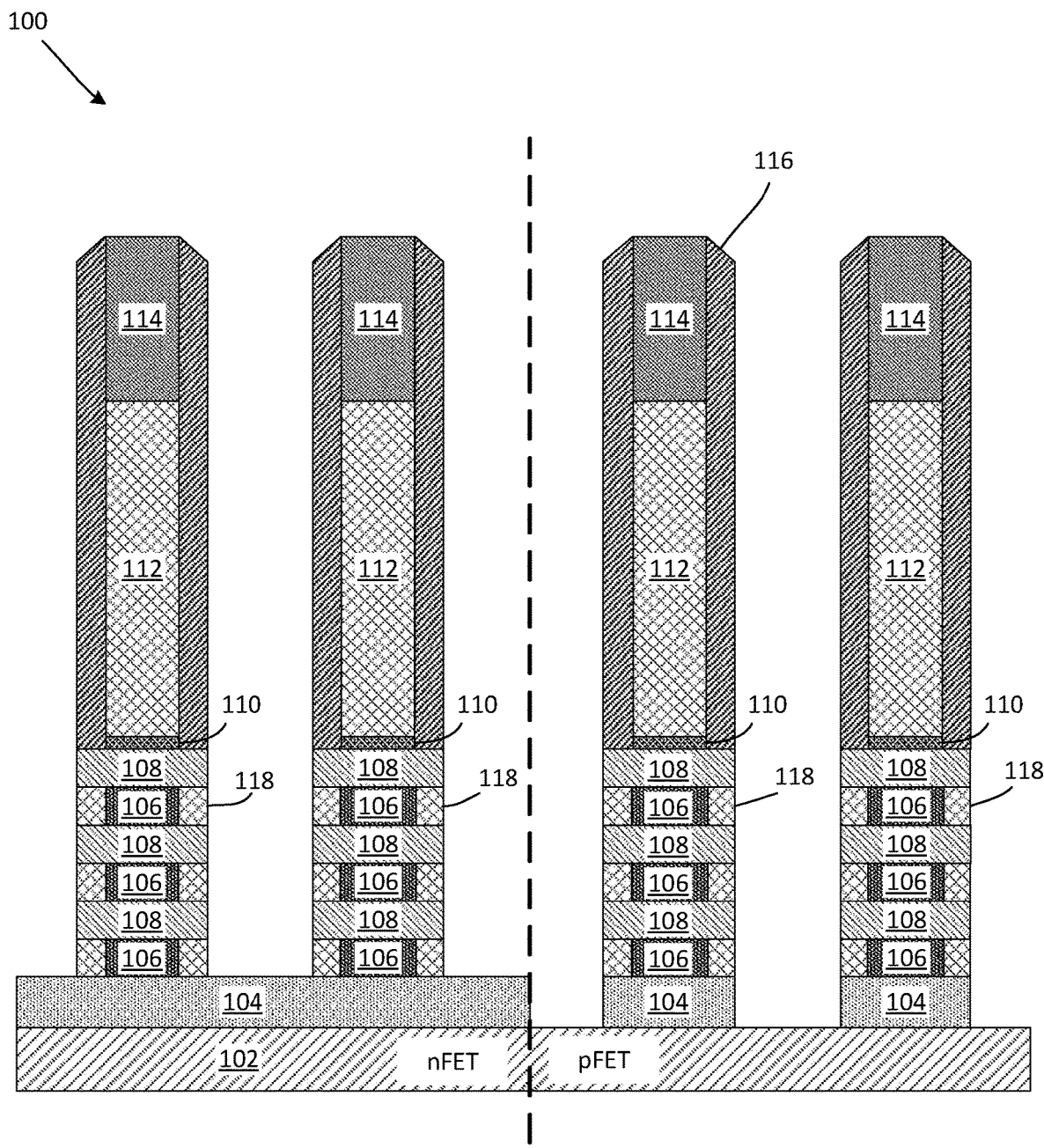
FIG. 9 is a cross-sectional view of the semiconductor device of FIG. 8 after additional fabrication operations, according to embodiments.

Referring now to FIG. 9, a cross-sectional view of the semiconductor device 100 of FIG. 8 is shown at a subsequent stage of the manufacturing process, according to embodiments. As shown in FIG. 9, inner spacers 118 are added in the recesses of the sacrificial layers 106. In certain embodiments, after the formation of the inner spacers 118, an isotropic etch process is performed to create outer vertical edges to the inner spacers 118 that align with outer vertical edges of the active semiconductor layers 108. In certain embodiments, the material of the inner spacer 118 is a dielectric material such as SiN, SiO, SiBCN, SiOCN, SiCO, etc. In certain examples, a material of the inner spacer 118 may be different than the material of the BDI layer 104.

Figure 10:
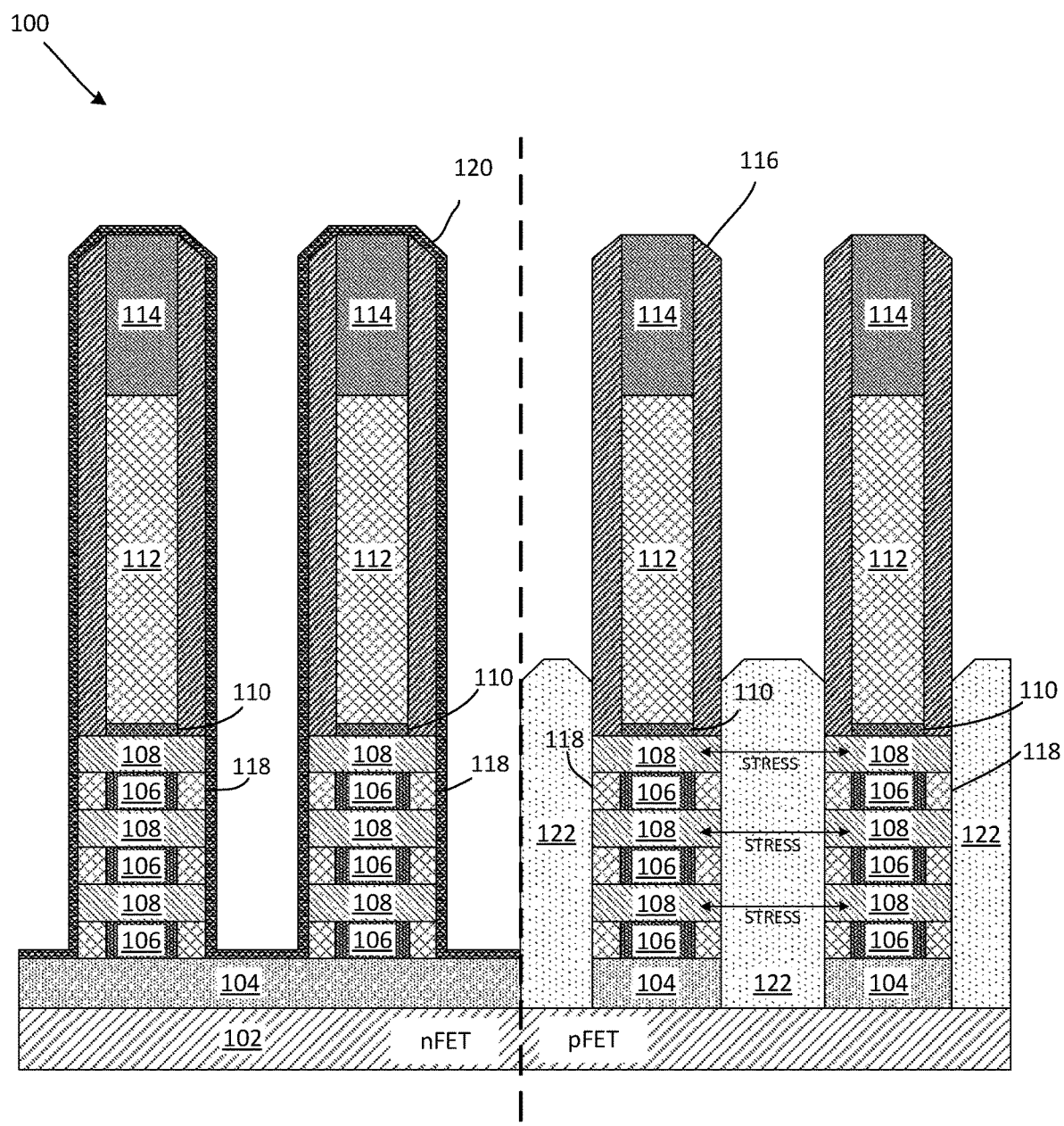
FIG. 10 is a cross-sectional view of the semiconductor device of FIG. 9 after additional fabrication operations, according to embodiments.

Referring now to FIG. 10, a cross-sectional view of the semiconductor device 100 of FIG. 9 is shown at a subsequent stage of the manufacturing process, according to embodiments. As shown in FIG. 10, an nFET liner layer 120 is first conformally deposited to cover the entire nFET region. Then, a pFET layer 122 is deposited by an epitaxial growth method up to at least the level of the top of the nanosheet stack 103. In certain embodiments, the material of the pFET layer 122 is SiGeB. However, it should be appreciated that any other suitable materials may be used. As is shown in FIG. 10, a bottom up epitaxial growth of the pFET layer 122 is accomplished by growing the layer directly on the upper surface of the substrate 102 (i.e., rather than being grown on the upper surface of the BDI layer 104). In certain examples, because of this epitaxial growth directly on the substrate 102, the compressive pFET layer 122 (e.g., SiGeB) induces strain on the pFET channel. As mentioned above, this additional strain may enable an increase in the hole mobility of the pFET channel, which may increase device performance. As indicated in FIG. 10 by the arrows labeled "STRESS", there is a compressive stress on the channel region of the pFET device caused by the epitaxial growth of the pFET layer 122 directly from the substrate 102. In certain examples, a capacitance reduction is still achieved on the pFET device because portions of the BDI layer 104 still exist under the pFET channel (i.e., the portions of the BDI layer 104 in the pFET region underneath the nanosheet stack 103).

Figure 16:
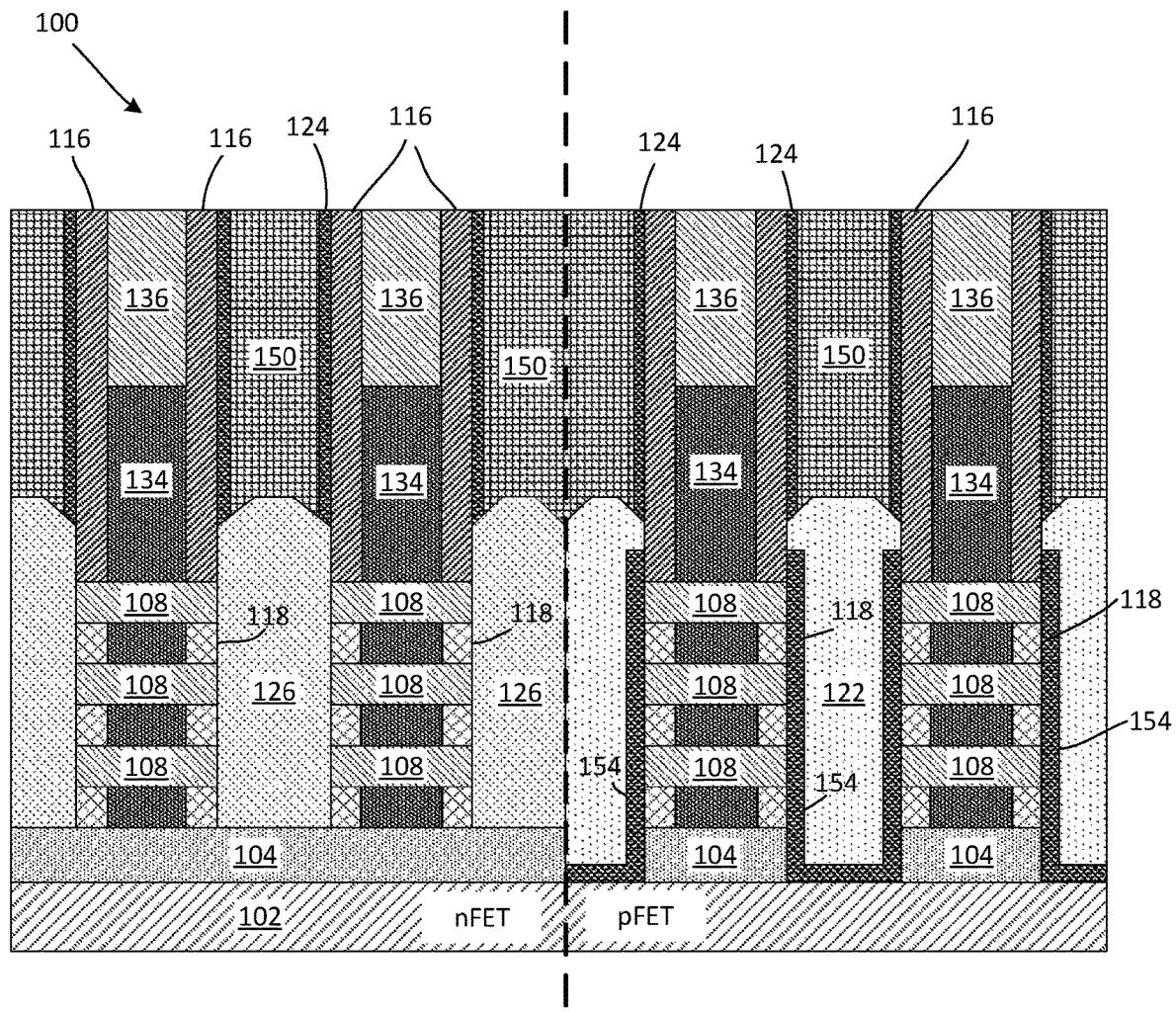
FIG. 16 is a cross-sectional view of a semiconductor device including a continuous EPI buffer liner layer formed in the pFET region, according to embodiments.

In certain embodiments, the pFET layer 122 may include a plurality of different layers. For example, as shown in FIG. 16, in the epitaxial deposition chamber, a first pFET liner layer 154 may be formed in situ. The first pFET liner layer 154 may be comprised of, for example, SiB. Then, the chemistry of the deposition chamber would be switch in situ to SiGeB, for example, to grow the remainder of the pFET layer 122. Thus, there would be a continuous SiB buffer layer (i.e., the pFET liner layer 154) in addition to the compressive SiGeB (i.e., the pFET layer 122) grown directly from the substrate 102 to induce stain on the pFET channel. In certain embodiments, the shape of the pFET liner layer 154 may a continuous u-shaped liner layer. In other embodiments, the shape of the pFET liner layer 154 may include discrete diamond-shaped structures extending from the silicon sheets (i.e., the semiconductor layers 108). These diamond-shaped structures would cover the sidewalls of the semiconductor layers 108, and they may also cover at least a portion of the sidewalls of the sacrificial layers 106.

Figure 11:
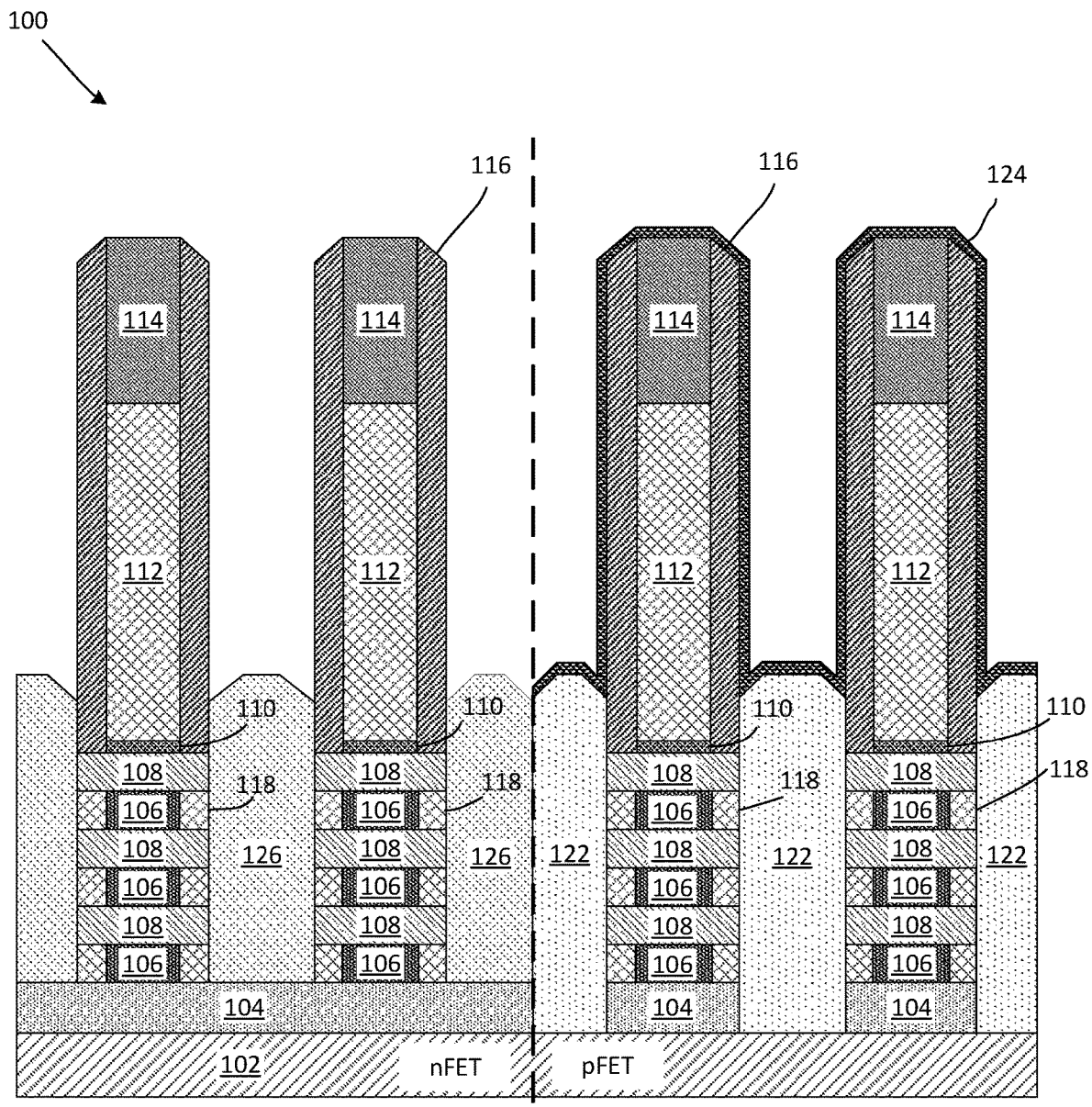
FIG. 11 is a cross-sectional view of the semiconductor device of FIG. 10 after additional fabrication operations, according to embodiments.

Referring now to FIG. 11, a cross-sectional view of the semiconductor device 100 of FIG. 10 is shown at a subsequent stage of the manufacturing process, according to embodiments. As shown in FIG. 11, the nFET liner layer 122 is first removed, followed by the formation of the liner layer 124. Then, an nFET layer 126 is deposited in the nFET region by an epitaxial growth method up to at least the level of the top of the nanosheet stack 103. In certain embodiments, the material of the nFET layer 126 is Si:P. However, it should be appreciated that any other suitable materials may be used. As is shown in FIG. 11, the BDI layer 104 remains in the nFET region, and it is introduced to separate the epitaxial growth of the nFET layer 126 from the substrate 102 to suppress nFET Source-Drain leakage through the substrate under the gate region for $L_g$=12 nm, for example. Thus, in contrast to the growth of the pFET layer 122 where there was nucleation of the epitaxial grown with the silicon substrate 102, there is no nucleation of the nFET layer 126 with the substrate 102. In certain examples, during the epitaxial growth of the nFET layer 126, there may be some nucleation of the layer with the exposed sidewalls of the silicon-based semiconductor layers 108. It should be appreciated that although the dashed line shown in FIG. 11 appears to show the pFET layer 122 in close proximity with the nFET layer 126, there may be more space separating the two regions, and the line is generically shown to indicate a boundary between the regions.

Thus, in certain of the present embodiments, a BDI section (i.e., the nFET region) and a non-BDI section (i.e., the pFET region) are co-integrated on the same substrate 102. This allows for the use of the BDI layer 104 in the nFET region, and under at least the channel regions of the nanosheet stack 103 in the pFET region. This also allows for enhanced strain in the pFET region by growing pFET layer 122 directly on the substrate 102.

Figure 12:
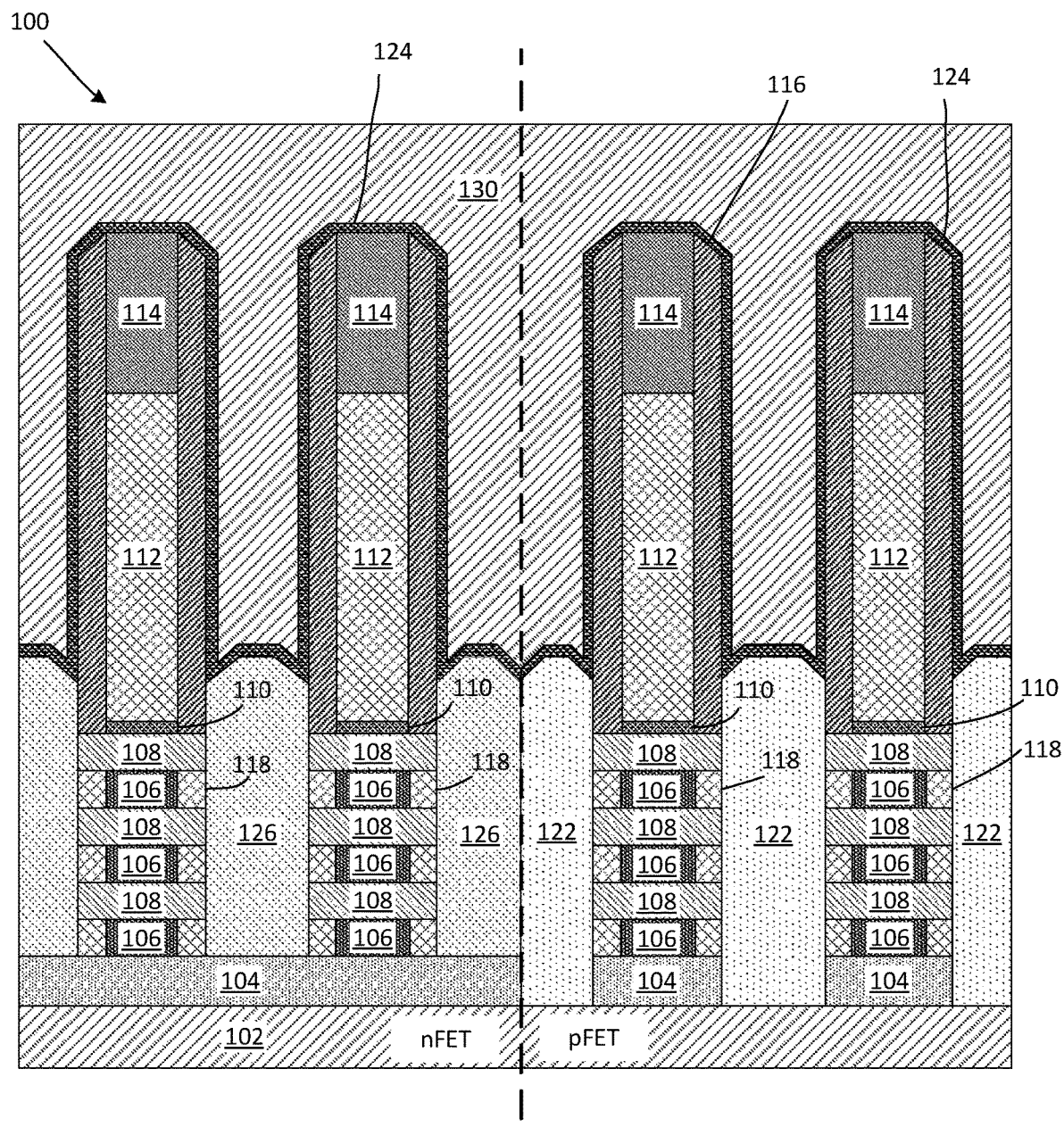
FIG. 12 is a cross-sectional view of the semiconductor device of FIG. 11 after additional fabrication operations, according to embodiments.

Referring now to FIG. 12, a cross-sectional view of the semiconductor device 100 of FIG. 11 is shown at a subsequent stage of the manufacturing process, according to embodiments. As shown in FIG. 11, following the formation of the nFET layer 126, the liner layer 124 (or an etch stop liner layer) is further grown to conformally cover the structures in the nFET region as well as in the pFET region. An interlayer dielectric (ILD) oxide layer 130 is then deposited in between and above the dummy gate 112 regions.

Figure 13:
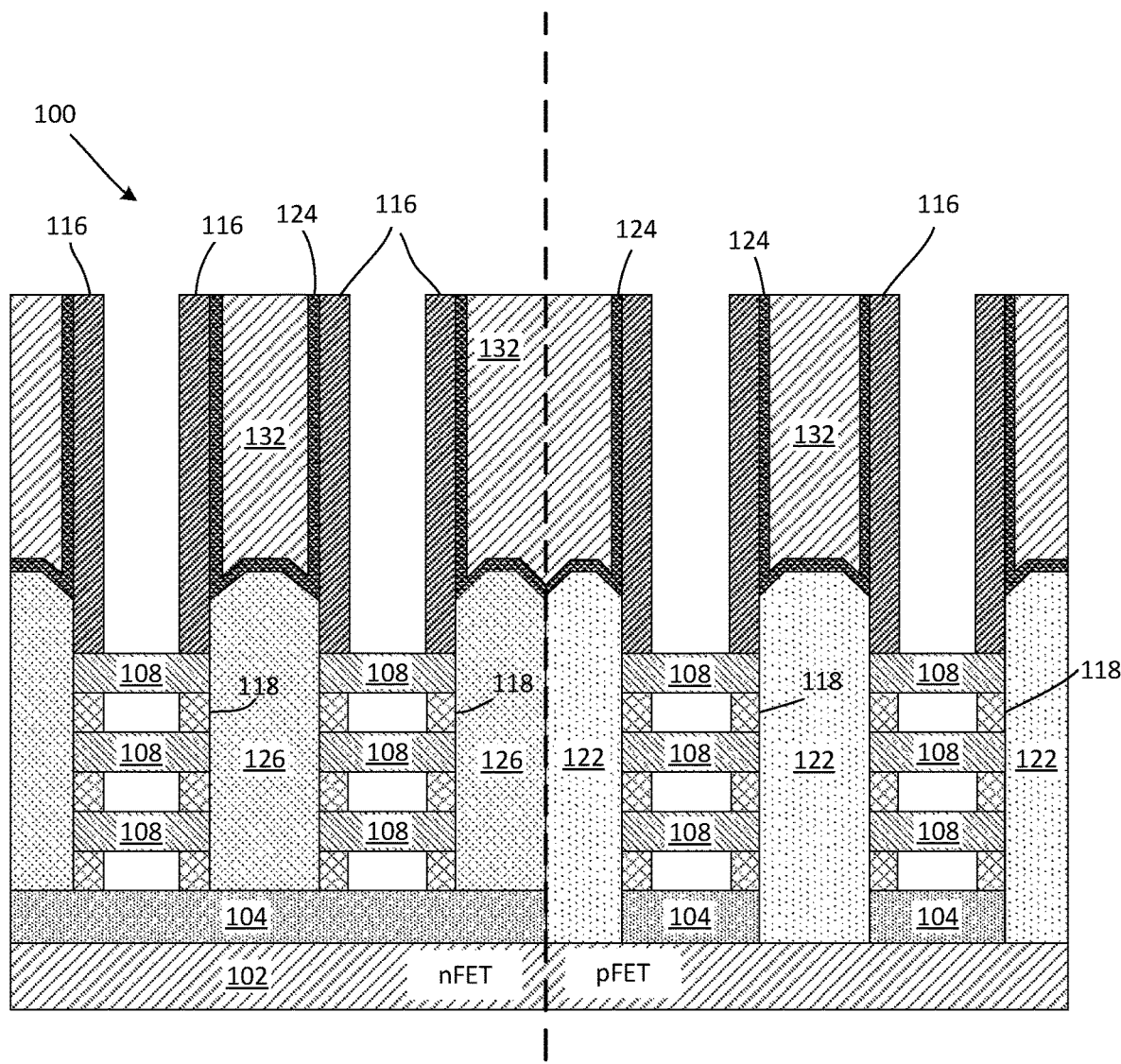
FIG. 13 is a cross-sectional view of the semiconductor device of FIG. 12 after additional fabrication operations, according to embodiments.

Referring now to FIG. 13, a cross-sectional view of the semiconductor device 100 of FIG. 12 is shown at a subsequent stage of the manufacturing process, according to embodiments. As shown in FIG. 12, following the formation of the ILD oxide layer 130, the ILD oxide layer 130 is subjected to a planarization process such as CMP. Then, a selective removal of the dummy gate hardmask 114, the dummy gate 112, the dummy gate oxide layer 110, and the sacrificial layers 106 (i.e., the SiGe suspensions) is performed. In FIG. 13, the dummy gate 112 has been removed by any suitable material removal process. Then, the sacrificial layers 106 are removed (or released). Thus, as shown in FIG. 13, there are void spaces between the active semiconductor layers 108 due to the removal of the sacrificial layers 106.

In certain embodiments, following the removal of the sacrificial layers 106 and the dummy gate 112, an interfacial layer (not shown) may be formed on the interior surfaces of the gate spacer 116 and the interior surfaces of the active semiconductor layers 108 and the inner spacers 118. Then, a high-κ layer (not shown) is formed to cover all of the surfaces of exposed surfaces of the interfacial layer. The optional interfacial layer and high-κ layer are not shown for ease of illustration.

Figure 14:
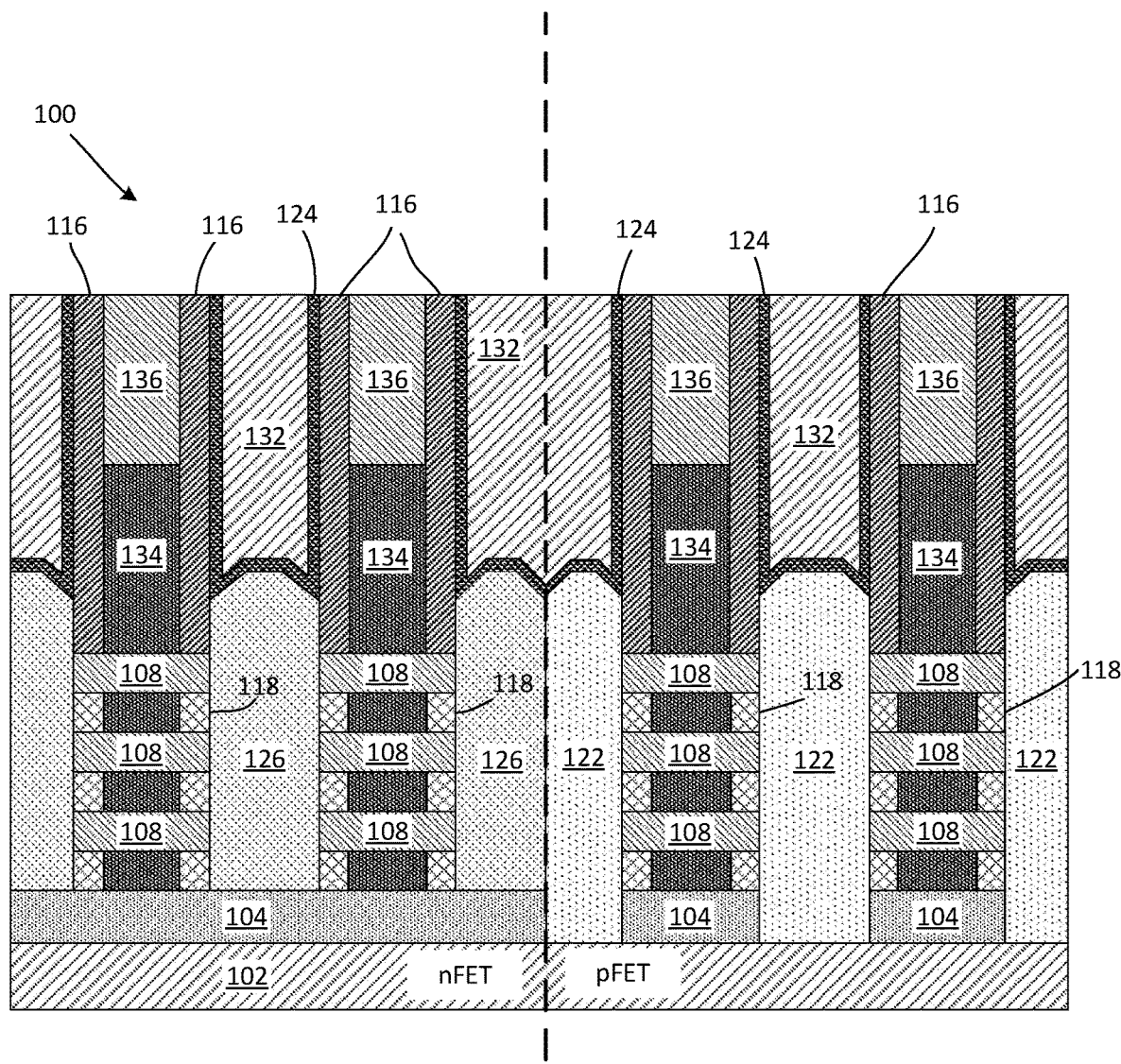
FIG. 14 is a cross-sectional view of the semiconductor device of FIG. 13 after additional fabrication operations, according to embodiments.

Referring now to FIG. 14, a cross-sectional view of the semiconductor device 100 of FIG. 13 is shown at a subsequent stage of the manufacturing process, according to embodiments. As shown in FIG. 13, following the removal of the dummy gate hardmask 114, the dummy gate 112, the dummy gate oxide layer 110, and the sacrificial layers 106, a high-κ metal gate (HKMG) 134 is formed on the nanosheet stack 103. In certain embodiments, the gate stack (or nanosheet stack 103 as depicted in FIG. 2) generally includes a work function metal (WFM) that sets the threshold voltage (Vt) of the device, a high-κ gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets. As shown in FIG. 14, a self-aligned contact cap (SAC CAP) 136 is formed on the HKMG 134.

Figure 15:
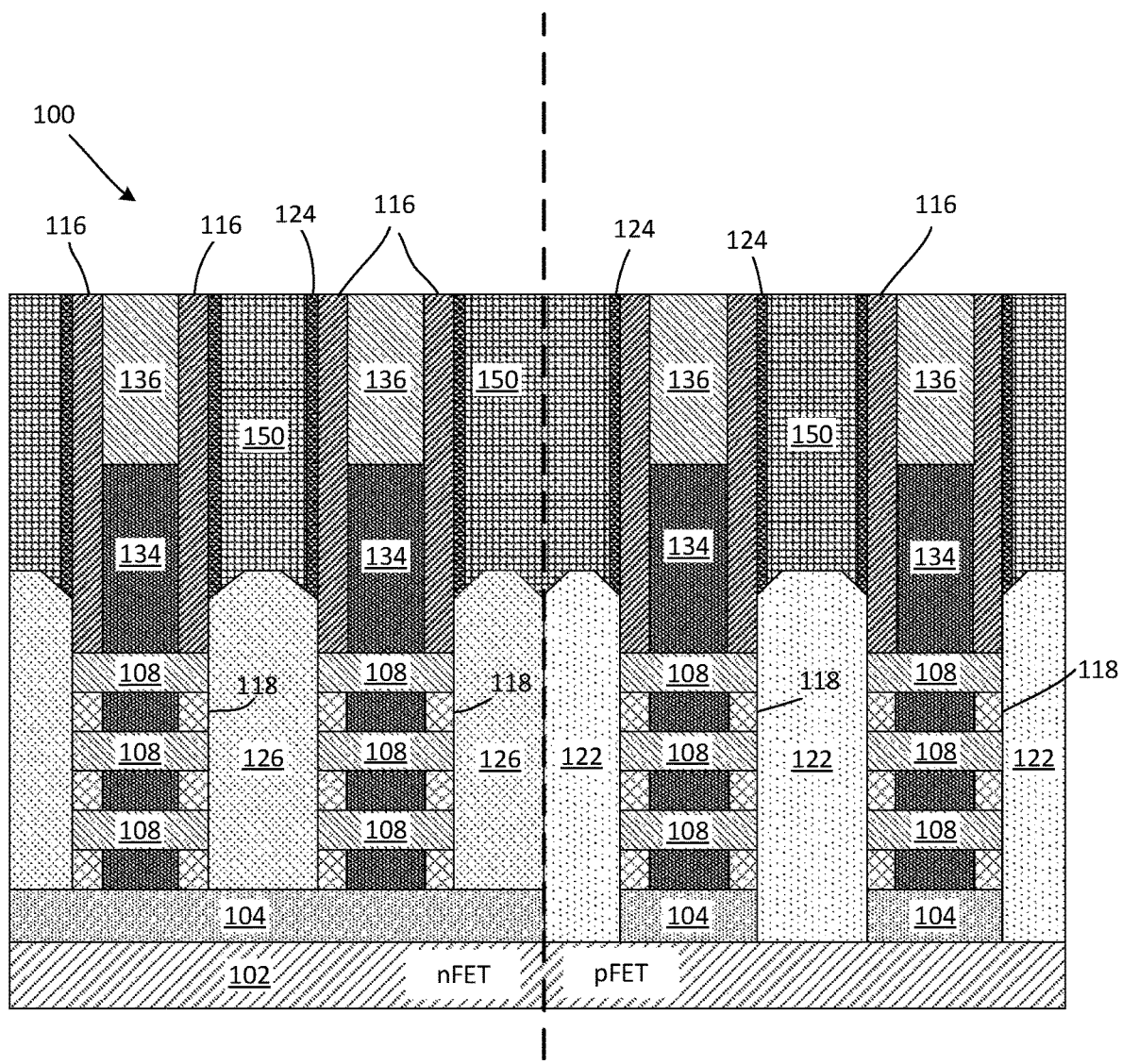
FIG. 15 is a cross-sectional view of the semiconductor device of FIG. 14 after additional fabrication operations, according to embodiments.

Referring now to FIG. 15, a cross-sectional view of the semiconductor device 100 of FIG. 14 is shown at a subsequent stage of the manufacturing process, according to embodiments. As shown in FIG. 15, following the formation of the HKMG 134 and SAC CAP 136, the ILD oxide layer 132 may be selectively removed down to the level of the tops of the pFET layer 122 and the nFET layer 126. Following the removal of the ILD oxide layer 132, a trench metal contact 150 is formed in the spaces left by the removal of the ILD oxide layer 132. In certain examples, the entire semiconductor device 100 may then be subjected to a CMP or some other suitable planarization process.

Although certain embodiments have been described where the BDI layer 104 is punched through (i.e., portions of the BDI layer 104 are removed down to the underlying substrate 102) only in the pFET region for strain enhancement, it should be appreciated that in alternative embodiments this can also be done in the nFET region. In such embodiments, the step of patterning the organic planarization layer 119 shown in FIG. 6 would not be needed, and the punch through of the BDI layer 104 (e.g., as shown in FIG. 7) would take place in both the pFET region and the nFET region. Thus, in these embodiments, strain enhancement may be engineered appropriately for both the pFET and nFET regions. Also, it should be appreciated that the amount of strain may be different in the pFET and nFET regions.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a semiconductor substrate;
    a transistor stack structure formed on the semiconductor substrate, the transistor stack structure including a first FET and a second FET, where the first FET is a different polarity than the second FET;
    a first source-drain epitaxial layer of the first FET formed on and in direct contact with the substrate adjacent to the first FET; and
    a second source-drain epitaxial layer of the second FET formed on the substrate adjacent to the second FET, wherein a bottom dielectric isolation layer is formed between the substrate and the second epitaxial layer.

2. The semiconductor device of claim 1, wherein the first FET is a pFET and the second FET is an nFET.

3. The semiconductor device of claim 1, wherein the first FET is an nFET and the second FET is a pFET.

4. The semiconductor device of claim 1, wherein the bottom dielectric isolation layer is also formed between the substrate and the first FET and between the substrate and the second FET, and wherein the bottom dielectric isolation layer is not present between the substrate and the first source-drain epitaxial layer.

5. The semiconductor device according to claim 1, wherein the bottom dielectric isolation layer is not present between the substrate and the first source-drain epitaxial layer.

6. The semiconductor device according to claim 1, wherein the first FET is a pFET including a pWF metal layer stack and the second FET is an nFET including an nWF metal layer stack.

7. The semiconductor device according to claim 1, wherein the first source-drain epitaxial layer of the first FET that is formed directly on the substrate generates strain that is applied to the first FET.

8. The semiconductor device according to claim 7, further comprising a liner layer that is a p-type epitaxial liner layer comprised of SiB,
    wherein the first source-drain epitaxial layer is a p-type epitaxial layer, and
    wherein the p-type epitaxial layer is comprised of SiGeB.

9. The semiconductor device according to claim 7,
wherein the first FET is a nanosheet structure including an active semiconductor layer or at least two stacked active semiconductor layers surrounded by gate stack layers, and
wherein the liner layer is a u-shaped layer covering sidewalls of the first FET and covering the substrate.

10. The semiconductor device according to claim 1, wherein the first FET has a gate length that is shorter than a gate length of the second FET.

11. The semiconductor device according to claim 1,
wherein the first FET is a p-type nanosheet structure including an active semiconductor layer or at least two stacked active semiconductor layers surrounded by gate stack layers, and
wherein the second FET is an n-type nanosheet structure including an active semiconductor layer or at least two stacked active semiconductor layers surrounded by the gate stack layers.

12. The semiconductor device according to claim 1, further comprising a spacer layer formed on gate sidewalls of the first FET and the second FET.

13. The semiconductor device according to claim 12, wherein a composition of the spacer layer is different than a composition of the bottom dielectric isolation layer.

14. A method of manufacturing a semiconductor device, the method comprising:
forming a transistor stack structure on a semiconductor substrate, the transistor stack structure including a first FET and a second FET, where the first FET is a different polarity than the second FET;
forming a first source-drain epitaxial layer on and in direct contact with the substrate adjacent to the first FET; and
forming a second source-drain epitaxial layer on the substrate adjacent to the second FET, wherein a bottom dielectric isolation layer is formed between the substrate and the second epitaxial layer.

15. The method according to claim 14, wherein the first FET is a pFET and the second FET is an nFET.

16. The method according to claim 14, wherein the first FET is an nFET and the second FET is a pFET.

17. The method according to claim 14, wherein the bottom dielectric isolation layer is also formed between the substrate and the first FET and between the substrate and the second FET, and wherein the bottom dielectric isolation layer is not present between the substrate and the first source-drain epitaxial layer.

18. The method according to claim 14, wherein the bottom dielectric isolation layer is not present between the substrate and the first source-drain epitaxial layer.

19. The method according to claim 14, wherein the first source-drain epitaxial layer of the first FET that is formed directly on the substrate generates strain that is applied to the first FET.

20. The method according to claim 14,
wherein the first FET is a p-type nanosheet structure including an active semiconductor layer or at least two stacked active semiconductor layers surrounded by gate stack layers, and
wherein the second FET is an n-type nanosheet structure including an active semiconductor layer or at least two stacked active semiconductor layers surrounded by the gate stack layers.

\* \* \* \* \*